United States Patent [19]

Bajor

[11] Patent Number: 5,633,180

[45] Date of Patent: May 27, 1997

[54] METHOD OF FORMING P-TYPE ISLANDS OVER P-TYPE BURIED LAYER

[75] Inventor: George Bajor, Melbourne, Fla.

[73] Assignee: Harris Corporation, Melbourne, Fla.

[21] Appl. No.: 456,727

[22] Filed: Jun. 1, 1995

[51] Int. Cl.⁶ .................................................. H01L 21/265
[52] U.S. Cl. .................. 438/358; 257/565; 257/592; 438/419; 438/495
[58] Field of Search ........................ 437/31, 76, 77; 148/DIG. 10, DIG. 11; 257/565, 592

[56] References Cited

U.S. PATENT DOCUMENTS

| | | | |
|---|---|---|---|
| 3,802,968 | 4/1974 | Ghosh et al. | 437/77 |
| 3,885,998 | 5/1975 | Reindl | 437/77 |
| 3,912,555 | 10/1975 | Tsuyuki | 437/77 |
| 4,038,680 | 7/1977 | Yagi et al. | 357/44 |
| 4,458,158 | 7/1984 | Mayrand | 307/270 |
| 4,667,393 | 5/1987 | Ferla et al. | 29/576 B |
| 4,721,684 | 1/1988 | Musumeci | 437/30 |
| 4,780,430 | 10/1988 | Musumeci et al. | 437/51 |
| 4,889,822 | 12/1989 | Musumeci et al. | 437/31 |
| 5,023,194 | 6/1991 | Gianella | 437/31 |
| 5,034,337 | 7/1991 | Mosher et al. | 437/31 |
| 5,118,635 | 6/1992 | Frisna et al. | 437/31 |

*Primary Examiner*—Jey Tsai
*Assistant Examiner*—Long Pham
*Attorney, Agent, or Firm*—Rogers & Killeen

[57] ABSTRACT

A method of fabricating a vertical conductive region in a semiconductor device in which plural epitaxial layers are successively grown on a substrate and a dopant is implanted into each epitaxial layer before growing the next layer. A fast vertical transistor operable in the GHz range and at high voltage (e.g., more than about 10 volts) is fabricated by growing plural epitaxial layers, each with a thickness less than about 2.5 microns until the desired height of the vertical conductive region is reached. Sections of the transistor's collector and an adjacent sinker are implanted through each epitaxial layer before the next layer is grown. Annealing after ion implant joins the sinker and collector sections in each layer with the corresponding sinker and collector sections in adjacent layers to form unitary structures in the transistor. Each layer is thin enough for the dopant to penetrate to the bottom of the layer using conventional implant energy. The manufacturing process does not limit the height of the sinker or collector.

19 Claims, 3 Drawing Sheets

METHOD OF FORMING P-TYPE ISLANDS OVER P-TYPE BURIED LAYER

BACKGROUND OF THE INVENTION

The present invention relates to the fabrication of semiconductor devices and more specifically, to a process for fabricating a vertical conductive region in a semiconductor device using plural epitaxial layers.

As is known, high speed bipolar transistors should have low collector resistance. To this end, a low resistivity region ("buried layer") with the same conductivity type as the collector is placed under the collector. Typically, integrated circuits include a collector contact that is on top of the transistor. To further reduce collector resistance, the collector contact on top of the transistor may be linked to the buried layer with a further low resistivity region denoted a collector sinker.

NPN transistors are used in many integrated circuits because they have better electrical performance than PNP transistors, and because they are easier to fabricate. A common procedure for fabricating an NPN transistor in an integrated circuit is to form an N+ buried layer in the substrate by selective ion implantation, and to grow an N-type epitaxial layer on top of the buried layer that will serve as the collector of the transistor. An N+ collector sinker may be formed by selectively implanting and diffusing N-type dopant into the epitaxial layer.

The fabrication process is similar for complementary bipolar circuits where both NPN and PNP transistors are used, although extra steps may be needed for the PNP transistor. The extra steps typically include the formation of a P+ buried layer and the P-type collector. To simplify fabrication, a P+ collector sinker may be omitted.

As seen for example in FIG. 1, a conventional fast vertical PNP transistor 10 in a complementary bipolar circuit may contain a P-type vertical conductive region that includes a low resistance buried layer 12 within an N-type region of a substrate 14 that is contacted by a sinker 16 and a collector 18 extending through an N-type epitaxial layer 20.

Typically the breakdown voltage of a fast transistor operating in the GHz frequency range is about 10 volts or less, and the epitaxial layer 20 has a thickness of about 2.5 microns or less. The P-type collector 18 and P+ collector sinker 16 may be formed in epitaxial layers of this thickness with a single implantation and appropriate diffusion. If, however, the breakdown voltage is to be larger, a thicker epitaxial layer will be needed. Epitaxial layers thicker than 2.5 microns may be too thick for a conventional low energy implanter (they do not have enough energy to implant the doping ions to the bottom of the layer), and high energy implanters (e.g., MeV) are needed. High energy implanters are expensive and also have depth limitations. Alternative methods that do not use high energy implanters may compromise transistor high frequency performance. One prior art method that is disclosed in U.S. Pat. No. 5,023,194 issued Jun. 11, 1991 to Gianella suggests simultaneously up and down diffusing collector regions deposited on opposing surfaces of an epitaxial layer to join the two diffused portions into a single vertical collector. The approach suffers from long diffusion time (and associated costs), and does not afford the opportunity to include a buried layer and a sinker adjacent the down-and-up diffused collector.

Accordingly, it is an object of the present invention to provide a novel method of fabricating a vertical conductive region in a semiconductor device that obviates the problems of the prior art.

It is a further object of the present invention to provide a novel method of fabricating high-voltage, vertical PNP transistors, operable in the GHz range, with conventional dopant implants.

It is still a further object of the present invention to provide a novel method of making vertical conductive regions in which plural epitaxial layers are separately implanted with dopant before the next layer is grown to form a unitary component of a vertical transistor.

It is another object of the present invention to provide a novel method of fabricating a vertical conductive region in a vertical PNP transistor in which the manufacturing process does not limit the thickness of the vertical conductive region.

It is still another object of the present invention to provide a novel method of fabricating vertical bipolar PNP transistors in which conventional implants in each of separate epitaxial layers implant dopant into each layer before the next layer is grown to construct vertical transistor sinker and collector regions.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 2A:
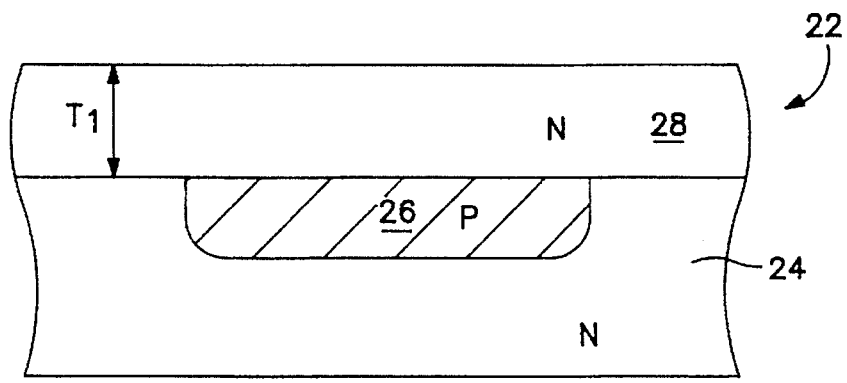
FIGS. 2A–2C are vertical cross sections illustrating an embodiment of the method of the present invention in various fabrication steps.

With reference now to FIG. 2A, in a preferred embodiment of the method herein, a semiconductor device 22 may be provided with a substrate 24 of a first conductivity type (N type is shown although the invention is not so limited). Using conventional methods, a buried layer 26 of the second conductivity type (P in this example) may be placed therein. A first layer 28 of the first conductivity type may be grown on the substrate 24. The thickness $T_1$ of layer 28 is desirably selected so that an implant of conventional energy (e.g., ion energy less than about 300 KeV) will allow the buried layer to diffuse upwards to join a downwardly implanted dopant. For example, $T_1$ may be from about 0.5 microns to about 2.5 microns, with the latter being preferred to reduce the number layers that will be needed to reach a desired height.

Figure 2B:
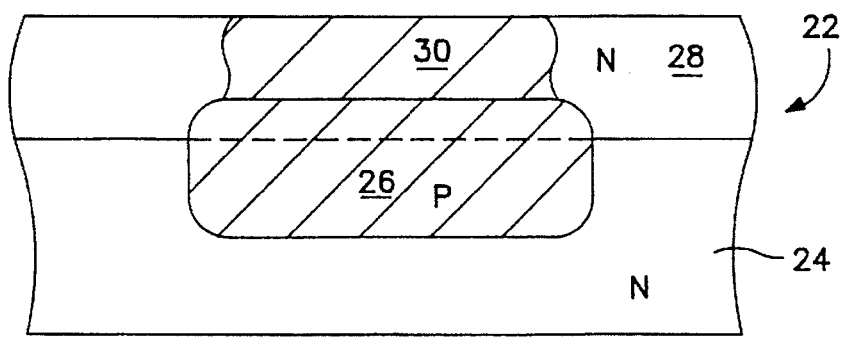

Referring now to FIG. 2B, a P type dopant may be implanted into the layer 28 over the buried layer 26 using a conventional energy implanter. The use of an ion implant energy of 240 KeV combined with the up-diffusion from the buried layer resulting from the subsequent high-temperature process steps typically found in semiconductor device fabrication (e.g., thermal oxidation, diffusions), has proved satisfactory. The dopant implant forms a P type vertical conductive region 30 that joins with the upwardly diffused P type buried layer 26 to form a unitary structure in the semiconductor device.

Figure 2C:
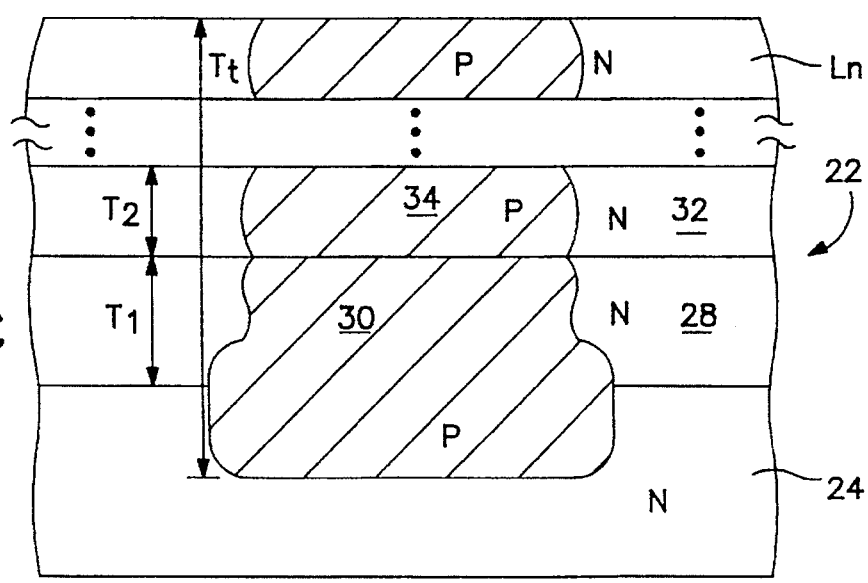

Referring now to FIG. 2C, a second N type epitaxial layer 32 may be grown over the first layer 28. The thickness $T_2$ of the second layer 32 is desirably selected so that conventional energy implants will extend to the surface of the first layer 28. For example, $T_2$ may be from about 0.5 microns to about 1.5 microns, with the latter being preferred to reduce the number layers that will be needed to reach a desired height. A second conventional implant of P type dopant may be implanted into the second epitaxial layer 32 to form a further portion 34 of the vertical conductive region: that is, the vertical conductive region 30 is extended vertically to the top of the second layer 32.

Subsequent high temperature processes (such as annealing) facilitates the joining of the conductive regions 30 and 34 to form a unitary structure, although there is little, if any, up-diffusion as was found in the first layer. Desirably the first and second implants are the same dose and energy to maintain the unitary structure of the vertical conductive region 30; that is, so that there is no discernable difference between dopant concentration in adjacent layers.

As further indicated in FIG. 2C, additional N type epitaxial layers $L_n$ may be grown by repeating the steps for the second layer 32 described above. These steps may be repeated n times until the desired height $T_t$ of vertical conductive region 30 is achieved. For example, $T_t$ may be from 5 microns to 25 microns.

Figure 3:
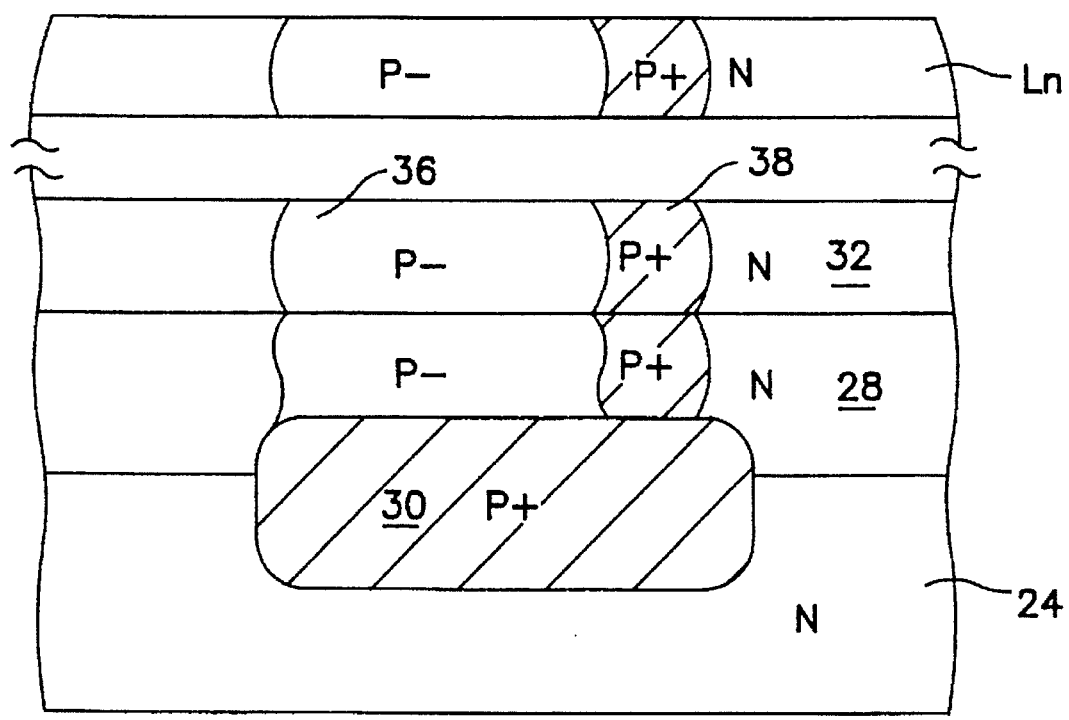
FIG. 3 is a vertical cross section of another embodiment of the present invention.

FIG. 3 illustrates another embodiment of the method of the present invention in which the vertical conductive region 30 includes a collector 36 and a sinker 38. The element numbers from FIG. 2 have been maintained for ease of reference. Using a conventional low energy implanter, a P type dopant may be implanted into the first epitaxial layer 28 over the buried layer. Two selective implants with different doses of implanted ions may form a section of P+ sinker 38 and a section of a P− collector 36 that join with the buried layer 32 and extend to the top of the first epitaxial layer 28.

As discussed above, subsequent layers may be grown and implants provided until each of the sinker and collector reach the desired height. Desirably, the high conductivity sinker and the collector each form separate unitary structures that are juxtaposed and in contact.

Figure 1:
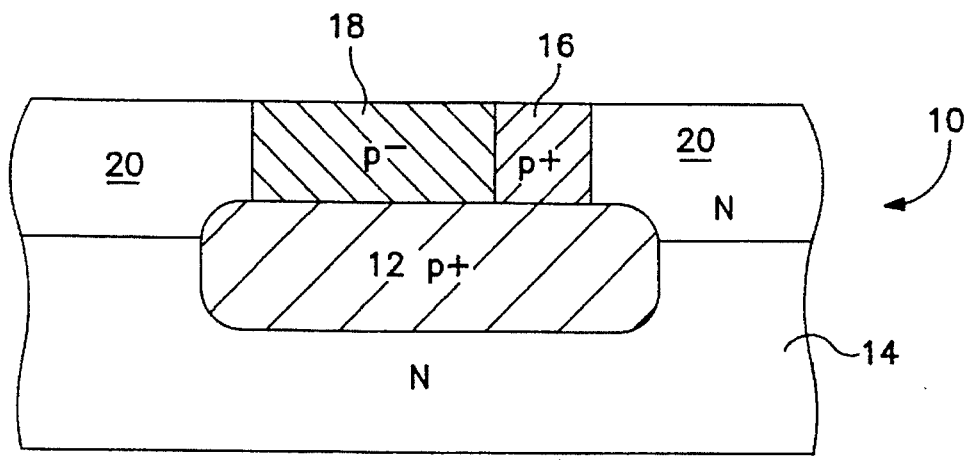
FIG. 1 is a vertical cross section of a portion of a conventional semiconductor device with a vertical conductive region.
Figure 4:
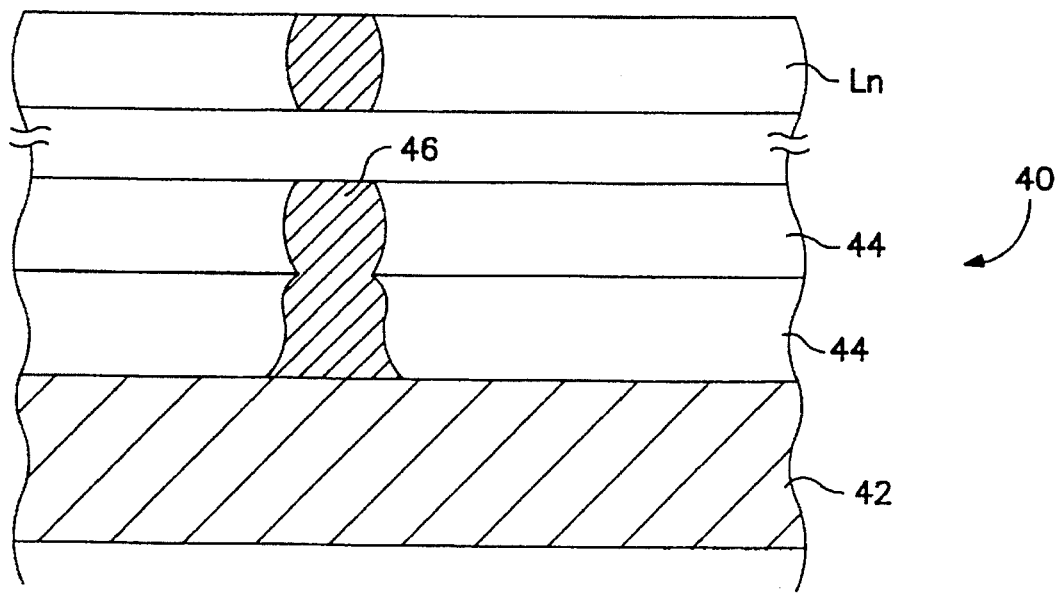
FIG. 4 is a vertical cross section of another embodiment of the present invention.

With reference now to FIG. 4, the method of the present invention may be used to form a unitary vertical structure in a transistor 40 with or without a buried layer in the substrate 42. All of the epitaxial layers 44 may be grown to about the same thickness if the up-diffusing buried layer is not present. As discussed above, the successive dopant implants into each epitaxial layer 44 form a vertical structure 46 in the semiconductor device.

References to P and N conductivity types are not limiting and the opposite conductivity types may be used.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A method of fabricating a vertical conductive region in a semiconductor device, the method comprising the steps of:
   (a) growing a first epitaxial layer of a first conductivity type on a substrate having a first region therein of a second conductivity type;
   (b) implanting a dopant of the second conductivity type into the first epitaxial layer over the first region so that together with an up-diffusion from the first region, the first region is extended vertically to a top of the first epitaxial layer;
   (c) growing plural second epitaxial layers of the first conductivity type atop the first layer; and
   (d) implanting a dopant of the second conductivity type into each of the second layers over the first region before a next one of the second layers is grown so that the first region is extended vertically to a top of the second layers,
   whereby the vertically extended first region forms a unitary vertical conductive region in the semiconductor device.

2. The method of claim 1 wherein the first layer is less than about 2.5 microns thick.

3. The method of claim 1 wherein each of the second layers is less than about 1.5 microns thick.

4. The method of claim 1 wherein each implanting step is less than about 300 KeV.

5. The method of claim 1 further comprising the step of repeating steps (c) and (d) until a desired thickness of the vertical conductive region is achieved.

6. The method of claim 1 wherein the first conductivity type is N.

7. The method of claim 1 wherein the first conductivity type is P.

8. The method of claim 1 wherein the vertical conductive region is of substantially uniform conductivity.

9. A method of fabricating a vertical PNP transistor, the method comprising the steps of:
   (a) growing a first N type epitaxial layer on an N type substrate, said N type substrate having a P type buried layer therein;
   (b) implanting P type dopant into the first epitaxial layer over the buried layer, wherein a portion of the implant provides a P+ sinker section and another portion of the implant provides a P− collector section;
   (c) growing a second N type epitaxial layer on the first epitaxial layer;
   (d) implanting P type dopant into the second epitaxial layer over the P+ sinker section and the P− collector section to extend the P+ sinker section and the P− collector section to a top of the second epitaxial layer; and
   (e) growing further epitaxial layers that are each implanted as set forth in step (d) before a next one of the further epitaxial layers is grown, until a predetermined thickness of the P+ sinker section and the P− collector section is achieved.

10. The method of claim 9 wherein the transistor is exposed to high temperature processes that facilitate formation of a unitary sinker section and a unitary collector section.

11. The method of claim 10 wherein the first layer is less than about 2.5 microns thick.

12. The method of claim 10 wherein the second layer is less than about 1.5 microns thick.

13. The method of claim 10 wherein the conductivity of the collector section is substantially uniform and the conductivity of the sinker section is substantially uniform.

14. A method of fabricating a vertical transistor, the method comprising the steps of:
   (a) growing a first layer of a first conductivity type less than approximately 2.5 microns thick on a first conductivity type substrate having a second conductivity type buried layer exposed on a surface thereof;
   (b) implanting a second conductivity type dopant into the first layer that joins an up-diffusing buried layer to form a vertical conductive region of the second conductivity type that extends to a top of the first layer;

(c) growing a second layer of less than approximately 1.5 microns of the first conductivity type on the first layer;

(d) implanting a second conductivity type dopant into the second layer that joins the vertical conductive region in the first layer so that the vertical conductive region extends to a top of the second layer;

(e) growing a third layer of less than approximately 1.5 microns of the first conductivity type on the second layer; and (f) implanting a second conductivity type dopant into the third layer that joins the vertical conductive region in the second layer so that the vertical conductive region extends to a top of the third layer.

15. The method of claim 14 wherein the dopant implants are made with an energy of less than 300 KeV.

16. The method of claim 14 further comprising the steps of growing further first conductivity type epitaxial layers of less than approximately 1.5 microns, and implanting dopant of a second conductivity type into each of the further layers before a next one of the further layers is grown so that the vertical conductive region extends to a top of the layers until a desired height of the vertical conductive region is achieved.

17. The method of claim 14 wherein the vertical conductive region includes a P+ sinker and a P− collector.

18. A method of fabricating a vertical PNP transistor having a sinker and a collector including the steps of:

(a) providing a N type substrate having a P type buried layer therein;

(b) sequentially growing thereatop plural N type epitaxial layers; and (c) after growing each one of the epitaxial layers, implanting a P type sinker section and a P type collector section over the buried layer, whereby each of the sinker and collector sections from each one of the layers join with ones of the sinker and collector sections from the layers adjacent thereto to form the sinker and collector of the PNP transistor capable of high-voltage, fast operation in a GHz range.

19. A method of fabricating a vertical NPN transistor having a sinker and a collector including the steps of:

(a) providing a P type substrate having an N type buried layer therein;

(b) sequentially growing thereatop plural P type epitaxial layers; and (c) after growing each one of the epitaxial layers, implanting an N type sinker section and an N type collector section over the buried layer, whereby each of the sinker and collector sections from each one of the layers join with ones of the sinker and collector sections from the layers adjacent thereto to form the sinker and collector of the NPN transistor capable of high-voltage, fast operation in a GHz range.

\* \* \* \* \*